United States Patent [19]

Go, deceased et al.

[11] Patent Number: 5,104,820
[45] Date of Patent: Apr. 14, 1992

[54] METHOD OF FABRICATING ELECTRONIC CIRCUITRY UNIT CONTAINING STACKED IC LAYERS HAVING LEAD REROUTING

[75] Inventors: Tiong C. Go, deceased, late of El Toro, Calif., by Jane C. Go, executor; Joseph A. Minahan, Simi Valley; Stuart N. Shanken, Laguna Niguel, both of Calif.

[73] Assignee: Irvine Sensors Corporation, Costa Mesa, Calif.

[21] Appl. No.: 720,025

[22] Filed: Jun. 24, 1991

Related U.S. Application Data

[63] Continuation of Ser. No. 377,241, Jul. 7, 1989, abandoned.

[51] Int. Cl.⁵ .................. H01L 21/52; H01L 21/56; H01L 21/58; H01L 21/60
[52] U.S. Cl. .................................. 437/51; 437/208
[58] Field of Search .................. 174/52.4; 357/75; 361/395, 392, 401; 437/208, 51

[56] References Cited

U.S. PATENT DOCUMENTS

| | | | |
|---|---|---|---|
| 3,657,029 | 4/1972 | Fuller | 437/246 |
| 4,551,629 | 11/1985 | Carson et al. | 437/208 |
| 4,597,003 | 7/1986 | Aine et al. | 357/26 |
| 4,706,166 | 11/1987 | Go | 357/75 |
| 4,880,708 | 11/1989 | Sharma | 437/246 |

Primary Examiner—Olik Chaudhuri
Assistant Examiner—David E. Graybill
Attorney, Agent, or Firm—Thomas J. Plante

[57] ABSTRACT

A process is disclosed which applies advanced concepts of Z-technology to the field of dense electronic packages. Starting with standard chip-containing silicon wafers, modification procedures are followed which create IC chips having second level metal conductors on top of passivation (which covers the original silicon and its aluminum or other metallization). The metal of the second level conductors is different from, and functions better for electrical conduction, than the metallization included in the IC circuitry. The modified chips are cut from the wafers, and then stacked to form multi-layer IC devices. A stack has one or more access planes. After stacking, and before applying metallization on the access plane, a selective etching step removes any aluminum (or other material) which might interfere with the metallization formed on the access plane. Metal terminal pads are formed in contact with the terminals of the second level conductors on the stacked chips. The pads and terminals are formed of the same metallic material in order to maximize T-connection conducting efficiency.

13 Claims, 8 Drawing Sheets

METHOD OF FABRICATING ELECTRONIC CIRCUITRY UNIT CONTAINING STACKED IC LAYERS HAVING LEAD REROUTING

This application is a continuation-in-part of application Ser. No. 07/377,241, filed July 7, 1989, now abandoned.

BACKGROUND OF THE INVENTION

This invention relates to the use of stacked structures (modules) comprising circuitry-carrying layers (IC chips); i.e., each layer has integrated circuitry thereon Such modules provide very densely packaged electronic circuitry. They may be used whenever space conservation in circuitry is desired, e.g., memory units, logic units.

The use of multiple layers in stacked units creates various processing problems, both during the pre stacking chip preparation, and during completion of the stacked unit, or module.

Because it is generally desirable to use IC wafers which are readily purchasable as standard (off-the-shelf) items, the existing on-chip leads require rerouting, in order to permit the eventual stacked unit to function as desired. In prior patents relating to the stacking of IC chips, it has been assumed that chip manufacturers will supply chips having leads suitable for use in stacked modules.

Among the prior relevant patents assigned to the assignee of this application are U.S. Pat. Nos. 4,525,921; 4,646,128; and 4,706,166. The first two listed patents deal with arrangements for avoiding short circuits in the stacked module, and for providing suitable electrical contact points on the access plane(s) of the stacked module, which contact points are available for connection to metallization on the access plane(s). The third listed patent deals with arrangements for bonding terminals on an access plane of a stacked module to terminals on a supporting, circuitry-providing substrate.

Rerouting the leads which are included in commercially available IC wafers has several advantages in the manufacture of stacked chip modules It also creates new problems. The present application deals with those problems, in order to make those advantages available. The assignee of this application has pioneered the use of stacked chips as focal plane modules having photodetectors on the focal plane. For example, see U.S. Pat. Nos. 4,551,629; 4,617,160; and 4,672,737. It also has pioneered the use of stacked chips as electronic modules for other fields, such as computer memory devices. There are significant differences between the two fields of use. The use as computer components may not require the extreme closeness of adjacent leads at the access plane; nor does it have the extremely restrictive power limits encountered in cryogenic photodetector enclosures.

However, a major challenge in providing stacked chips which serve as computer components is the zero tolerance of circuit failures. In a photodetector surveillance system, a certain percentage of outages (non-functioning circuits) is acceptable But in a computer component, every circuit must function properly. In the initial stack, extra chips are included to provide redundancy. This permits a limited number of imperfect chips in a completed stack to be disconnected. But the chips which remain in the operating component must have no circuit outages.

One of the electrical failure points in stacked chip modules has been the T-connections of the aluminum conductors on the chips with the metallization formed on the access plane That problem also provides motivation for the present invention.

SUMMARY OF THE INVENTION

The present invention includes both pre-stacking and post-stacking process steps which improve significantly the reliability of stacked chip electronic packages. Also, major commercial benefits are derived from the ability to utilize readily available IC wafers.

In the pre-stacking process, the chip leads are rerouted by providing a second layer of metallization formed on a passivation (insulation) layer covering the initial chip circuitry. The second layer of metallization has two purposes. The first purpose is to provide a different metal for the conductors which lead from the IC circuitry of the chip to the access plane of the chip and constitute the metal of the T-connections The T-conections on the access plane thus are formed of a much more reliable metal than aluminum The second purpose is to permit the second layer of metallization to change direction of the conductors, thereby permitting the use of readily available IC wafers.

Major benefits are obtained by using a relatively non-reactive (corrosion resistant) electrical conductor material, e.g., gold or copper, to form the lead re-routing metallization. Gold, which is usually the preferred metal, has numerous advantages over aluminum in the stacked structure, including major improvement in the quality (reliability and conductivity) of the T-connections The gold T-connections in the stacked structure constitute a marked advance over prior stacked structures.

The gold rerouting layer also permits a significant simplification of the pre-stacking process steps. In the stacked chip electronic packages, it is necessary to prevent potential short circuits by eliminating all undesired metallization, including portions of the original aluminum. The present invention avoids several steps at the wafer processing level by using a selective etching step to remove all remaining unwanted metal from the completed stack. Only the desired gold metallization remains in the final layer-containing module.

The use of a corrosion-resistant metallization material, i.e., gold, as the conducting material permits easy removal of the undesired material in the stack by a selective etching process performed on the stacked structure. A chemical is used which attacks and removes the undesired material, but does not damage the desired gold metallization.

In addition to the use of second layer metal which provides improved T-connections, the present invention deals with the problem of using the most appropriate insulation material as a film between the first and second layers of metal conductors. Significant considerations for the insulation film are reduction of its capacitive impedance, and avoidance of highly elevatged temperatures druing application of the insulation film.

BRIEF DESCRIPTION OF THE DRAWINGS

FIGS. 10A-10J are isometric views illustrating successive steps in the previously developed post-stacking steps;

DETAILED DESCRIPTION OF PREFERRED EMBODIMENT

An important aspect of the present invention is its success in providing a stacked layer electronic unit by improving both pre-stacking and post-stacking process steps. Where IC chips are intended for use in stacked layer units, there are numerous steps needed to prepare the chips for lamination. Also, integrated planning of the end-to-end process (from wafer modification to final electronic stacked unit) provides various functional and processing improvements. In other words, pre-stacking steps can favorably affect post-stacking steps, and vice versa.

Figure 1:
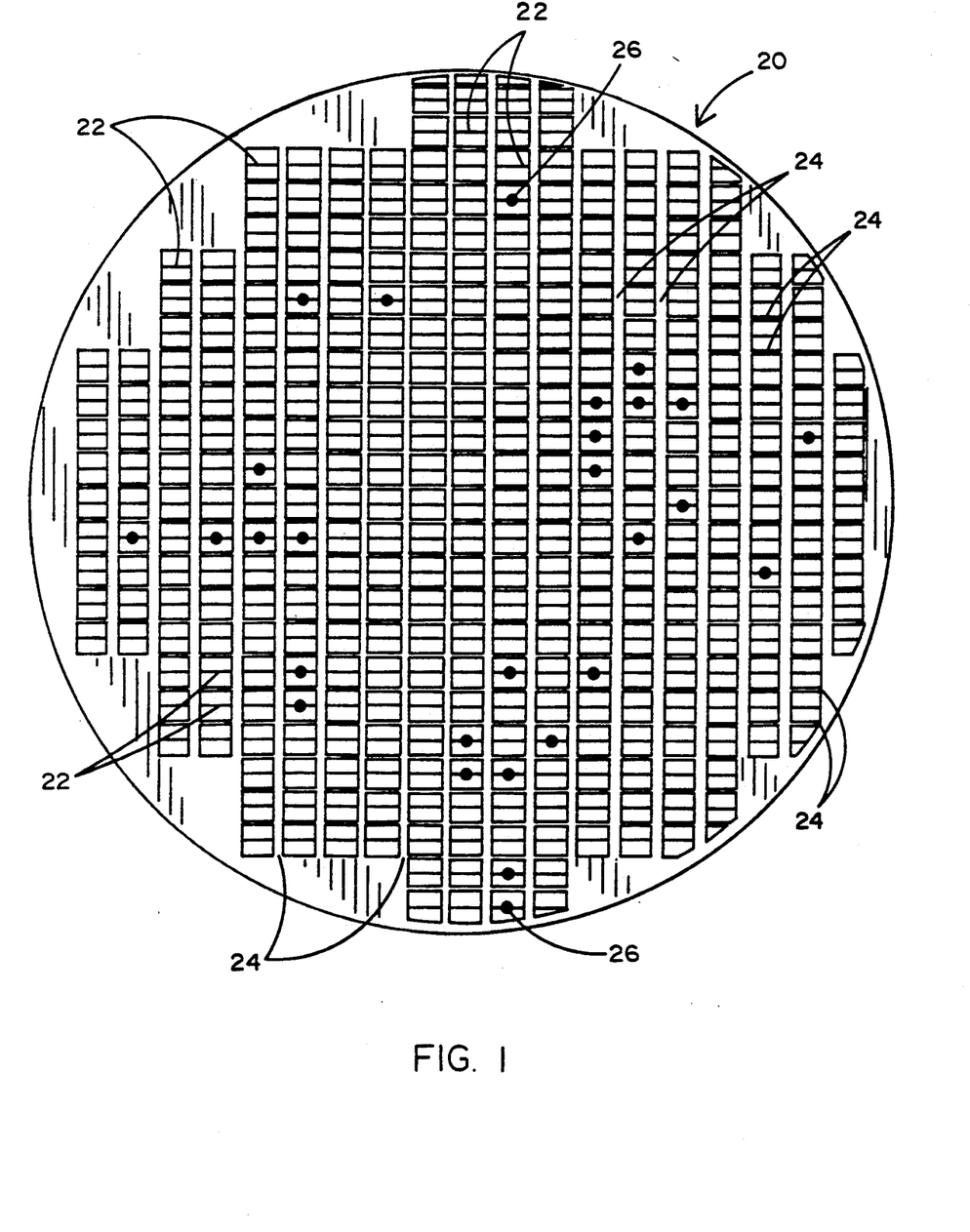
FIG. 1 is based on a photograph of a vendor-supplied IC wafer having a large number of separate dice, or chips.

FIG. 1 shows a plan view, taken from a photograph, of one manufacturer's original wafer 20, containing numerous IC chips, or dice, each of which is intended to become a separate chip, or die, 22 when the wafer has been cut along orthogonally-extending streets 24. The dice are tested at the wafer stage, and each failed die is marked with a black dot 26. The material in wafer 20 is silicon, although other IC chip materials may be used, e.g., gallium arsenide. The wafer in FIG. 1 has approximately a five inch diameter, and is approximately 0.024 inch thick. A major reason for preferring silicon ships in stacked modules is their relatively high heat dissipation efficiency. For example, silicon is 2 to 3 times more thermally conductive than gallium arsenide. A trade off for the advantages of silicon is the need for electrical insulation of the silicon because it is a semiconductor material having relatively high electrical conductivity. Gallium arsenide, also a semiconductor material, has electrical conductivity 3 or 4 orders of magnitude lower than that of silicon, and therefore is, in relative terms, an electrically insulating material.

Where the dice, or chips, are to be used as layers in a stacked structure, several steps should be performed in the wafer stage. Because the desired electronic density in the stack requires extremely thin chips, a thinning of the wafer is performed by removing material from its back surface. Performing the thinning process on individual chips would be extremely difficult, because of their minuteness. The thickness of the wafer 20 will be significantly reduced, e.g., from 24 mils to 4 mils (or less).

The wafer 20 is wax mounted face down on a rigid disc whose thickness has been measured to an accuracy of 0.001 mils and shown to be flat to within 0.05 mils. The thickness of the disc is fed into a computer and a calculation is made to give a final thickness of the wafer/disc sandwich which will keep the wafer thickness within a 0.1 mil range. The wafer is then ground to a calculated thickness. After grinding, the wafer is etched to its final thickness. The etching serves two purposes: fine-tuning of the final thickness, and removal of strain induced in the material by the grinding. After demounting and cleaning, the wafer thickness is measured to within 0.001 mil. The thickness data is then fed into a computer stacking program for later use.

Figure 2:
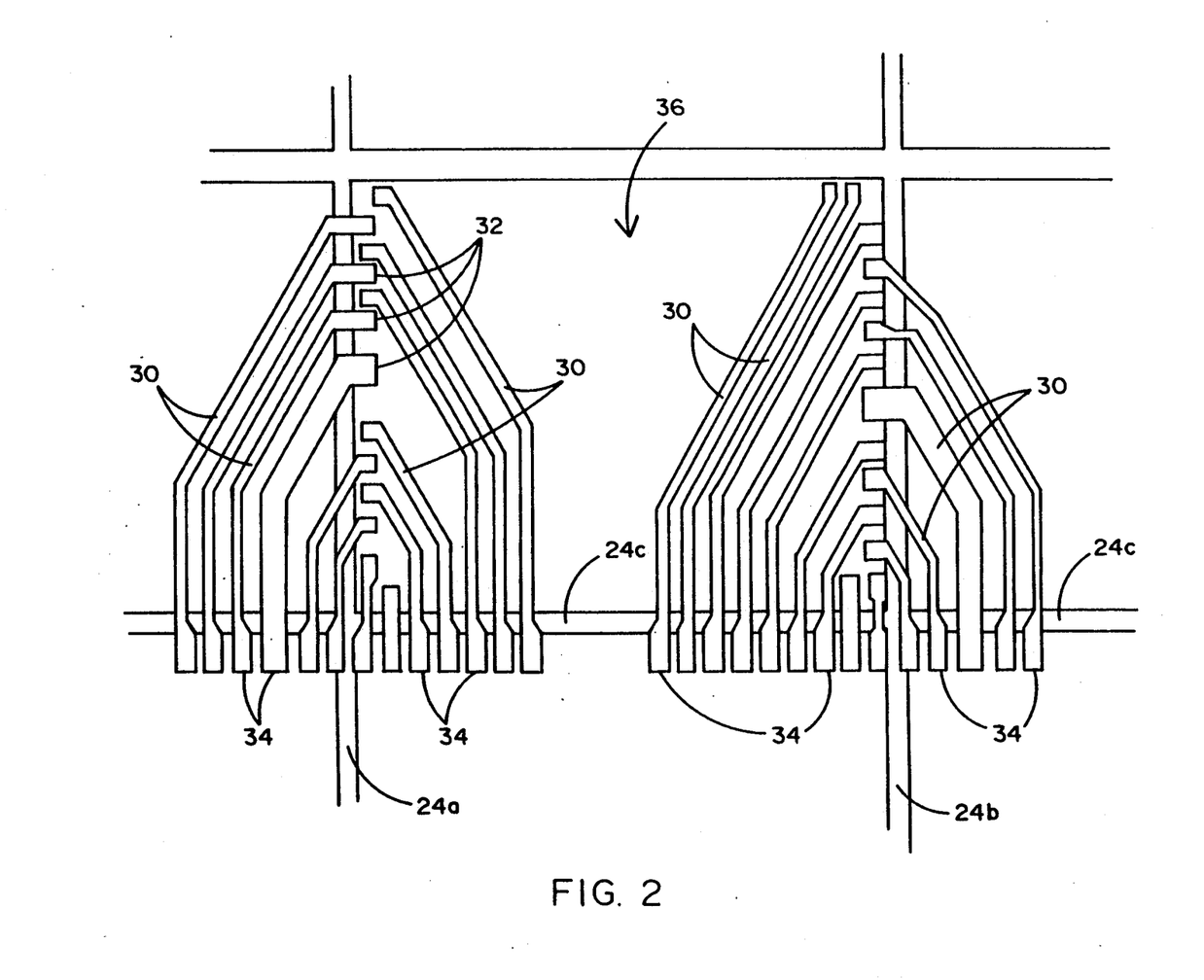
FIG. 2 is based on a photograph showing a close up of a six dice group, which has been modified to provide a single die suitable for use in a stacked layer package.

Before describing the step-by-step wafer modification process, an explanation of the modification goal is in order. FIG. 2 is based on a close up photograph of a single die after modification. After forming a passivation (insulation) layer on the front (top) surface of the existing wafer, rerouting leads have been formed, preferably using gold as the material. A plurality of electrically parallel gold leads 30 are shown connecting gold terminals 32 to gold terminals 34. The terminals 32 extend through holes in the passivation layer to make electrical contact with the metal terminals, usually aluminum, formed on the original IC chip 36, which is having its leads rerouted for use in a stacked layer module.

At the other ends of the leads 30, new terminals 34 are provided, which will be in electrical (and mechanical) contact with metallization formed on the access surface of the stacked layer module. Thus far, it has been preferable to locate all of the terminals 34 along one edge of the modified chip. However, the rerouting process could be used to bring gold leads to more than one face of the stacked layer module. The rerouting is highly desirable because it permits (a) the use of standard wafers to provide chips for stacking, and (b) the use of gold leads and terminals, which have numerous advantages as electrical conductors over aluminum.

Figure 3:
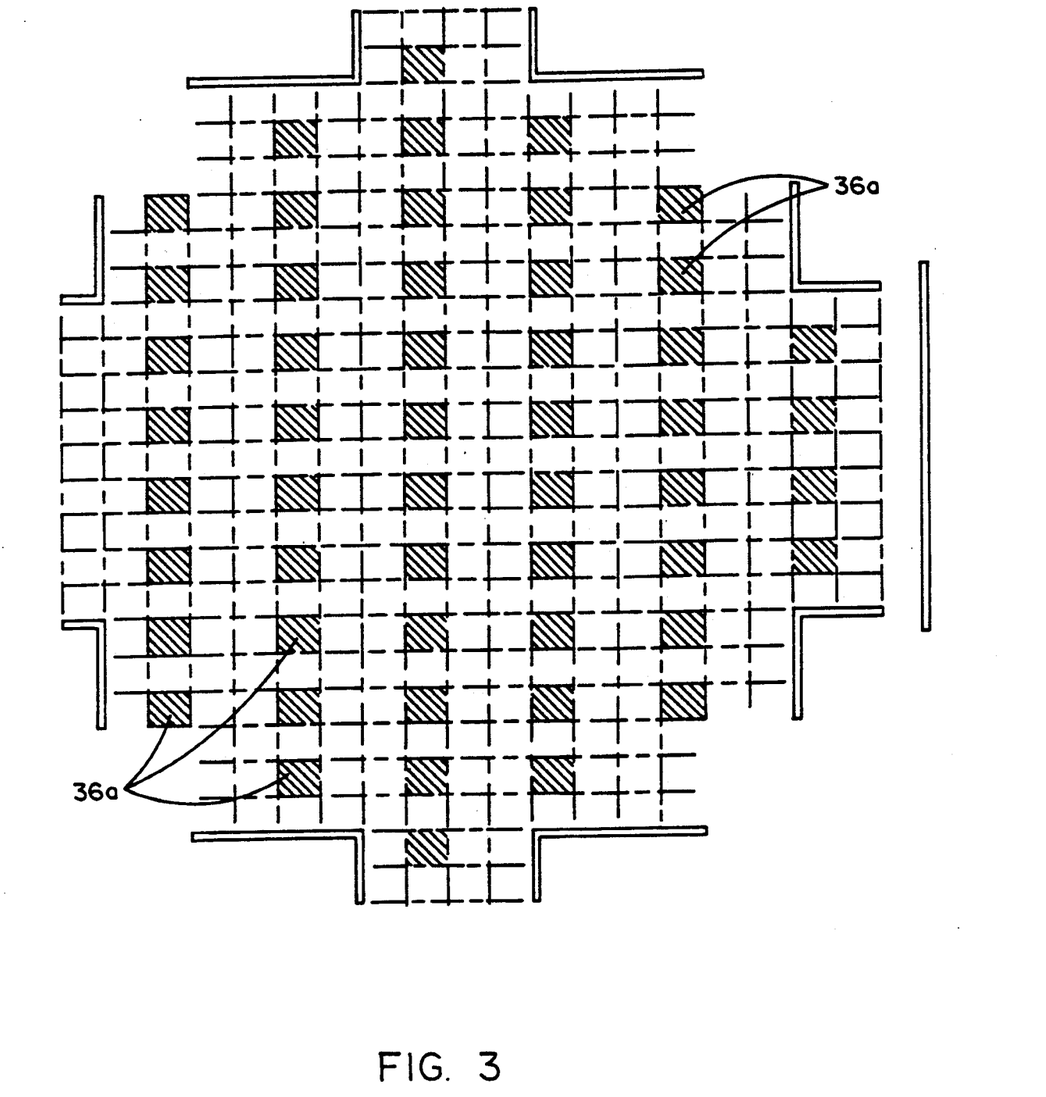
FIG. 3 is a diagram of a wafer, on which are identified the one out of every six dice which are modifiable in this particular wafer.
Figure 4:
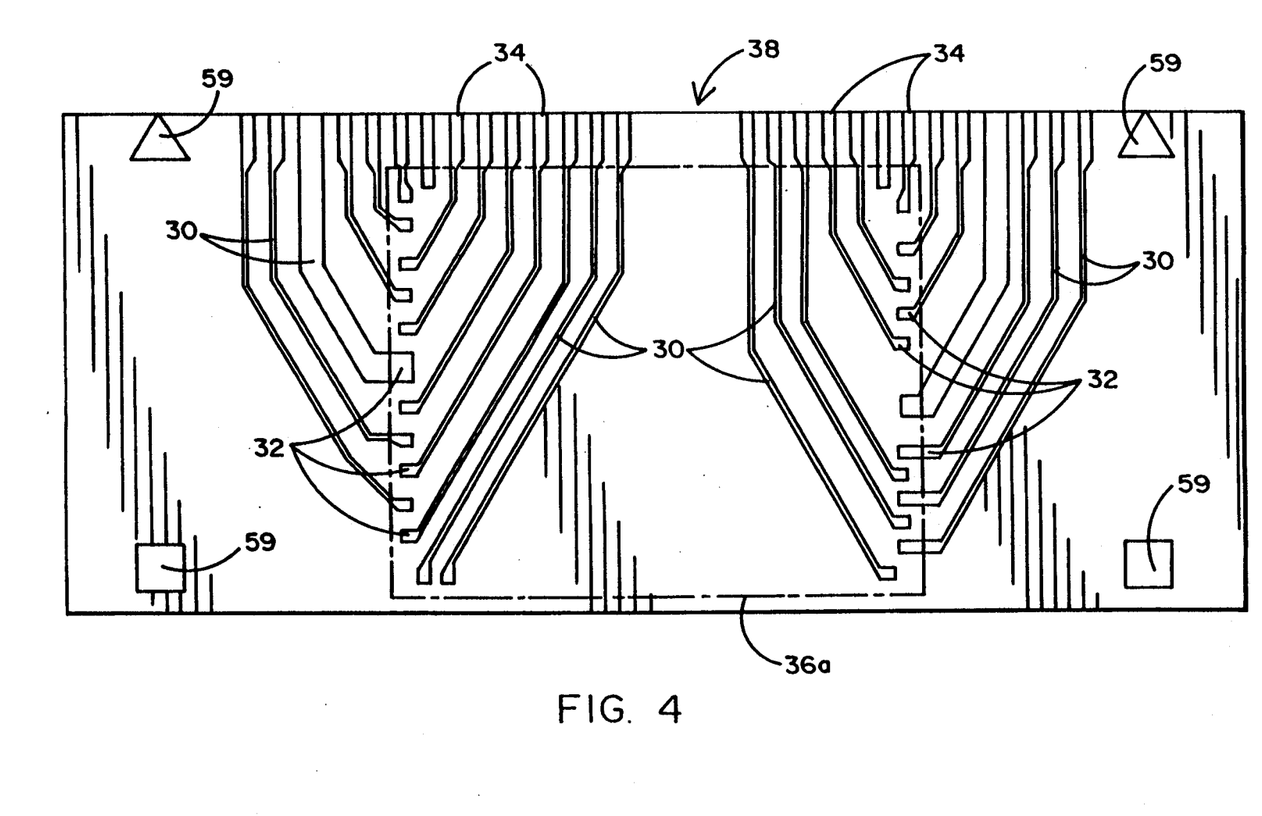
FIG. 4 shows the layout of an individual modified die after it has been cut out of the wafer.

As seen in FIG. 2, and as diagrammed in FIGS. 3 and 4, the modified chip taken from the wafer of FIG. 1 uses six of the dice included in the wafer. This ratio is subject to improvement as different wafers are developed. In FIG. 3, the cross-hatched dice 36a are those which are modifiable, if each modified chip requires six original dice. In FIG. 2, the gold rerouting leads are shown crossing over two vertical streets 24a and 24b, and over one horizontal street 24c. Those original die which show black dots in FIG. 1 are not usable as IC chips chosen for lead rerouting.

FIG. 4 shows the shape of a chip 38 which has been cut from the wafer, in order to be used in a stacked chip module. The area of the stackable chip is the entire area of FIG. 4, whereas the area of the original chip, whose terminals have been connected to the gold rerouting leads, is that included in the dashed line rectangle 36a.

After thinning of the original wafer, and before the rerouting of leads, layers of passivation (insulation) are applied to both the front and back surfaces of the wafer. The front surface passivation is required because additional rerouted electrical conductors are to be formed above the existing IC circuitry. The back surface passivation is required because each layer (chip) will be next to the electrical conductors formed on the layer below.

Choosing the passivation material(s) presents certain problems. The insulating layers are chosen on the basis of: their electrical insulating properties; their mechanical properties—which include strength, porosity, etc.; their method of deposition; and their ease of delineation. There are a number of insulating thin film materials that are used in the semiconductor device industry. Primary materials are silicon dioxide, silicon nitride, silicon oxynitride, phosphosilicate glass, and various polyimides. Silicon nitride (SiN) and silicon oxynitride (SiON) have certain advantages, e.g., mechanical strength, humidity barrier, and etching qualities. Polyimides have certain advantages, e.g., ease of deposition, low dielectric constant, and ability to form layers of greater thickness.

A problem which polyimides tend to avoid is excessive capacitance. This is true because of (a) their relatively low dielectric constant, and (b) their greater thickness potential.

If SiN and SiON are used, a consideration in choosing between them is their respective etch rates. SiON etches eight times faster than SiN in buffered oxide etch (7:1). When buffered oxide etchant is used to remove unwanted passivation, the great difference in etch rates allows full etching of SiON on the top surface of the wafer, while SiN thickness on the bottom of the wafer is reduced only by about 12%. If the starting thickness of both insulation layers is approximately the same, removal of the SiON from selected locations on the top surface will leave the SiN on the bottom surface largely intact. If SiON is the insulation layer on the front surface (i.e., the device-carrying surface) of wafer 20, and SiN is the insulation layer on the back surface of wafer 20, synergistic benefits are obtained. The fracture safe SiON is used where that characteristic is of value; and the relatively etch-resistant SiN is used where that characteristic is of value (because adequate passivation remains on the entire back surface, while being fully removed in selected locations on the front surface).

Figure 5:
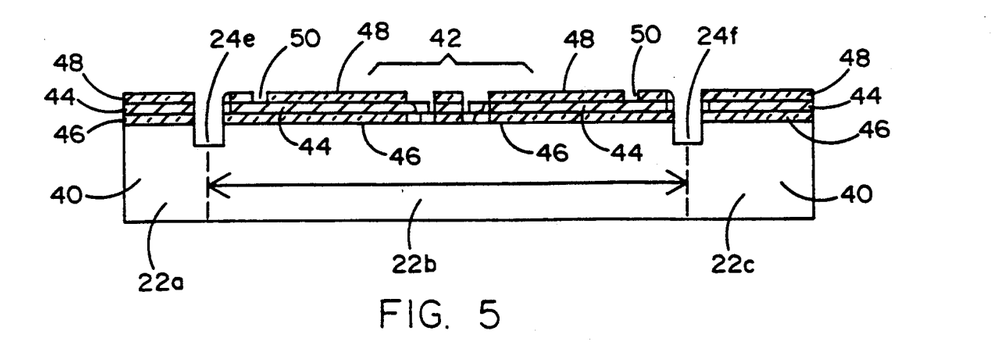
FIGS. 5-9 are cross-sections (greatly enlarged) taken through a portion of a wafer, and showing the structural details during successive steps in the wafer modification process.
Figure 5A:
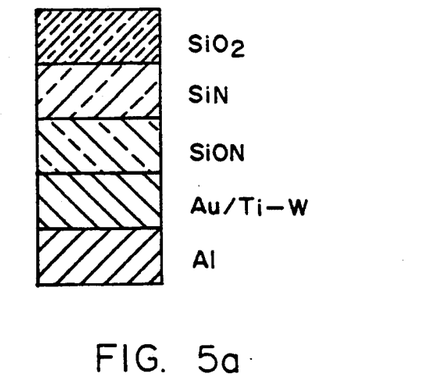

FIGS. 5-9 show the changes in a small segment of the wafer cross-section as subsequent modification steps are taken. FIG. 5A provides a guide to the drawing symbols used to identify the different materials shown in FIGS. 5-9. FIG. 5 shows the wafer cross-section before any modification. The silicon body of the wafer is indicated by numeral 40. Streets 24e and 24f provide the cutting lines along which three dice—22a, 22b and 22c—would have been separated if the modification steps were not used. The arrows between the dashed lines show the width of the modifiable center die 22b. A device area on the upper surface of die 22b is indicated by a bracket having the numeral 42.

Aluminum (Al) metallization indicated by numeral 44 is used to provide conductors which connect the IC device area 42 to the terminals at which the chip will be connected electrically to exterior circuitry. A first layer 46 of silicon dioxide ($SiO_2$) is shown below the aluminum metallization 44; and a second layer 48 of silicon dioxide is shown above the aluminum metallization 44. The $SiO_2$ provides protection and insulation for the wafers supplied by the vendor. Openings 50 provided in upper layer 48 of $SiO_2$ are available for connecting metallic conducting material which will contact the aluminum 44, and will thus provide terminal pads for connection to exterior circuitry.

As discussed above, and as shown in FIG. 6, a layer 52 of insulation (polyimide or SiON) is deposited over the entire upper (device) surface of the wafer; and a layer 54 of insulation (e.g., SiN) is deposited over the entire lower surface of the wafer. Deposition of the insulating films 52 and 54 may be performed by plasma-enhanced chemical vapor deposition (PECVD) at 380° C. in gas mixtures of silane, nitrous oxide, nitrogen, ammonia and argon. The exact mixture is dependent upon which of the films is being deposited The plasma-enhanced chemical vapor deposition (PECVD) is used instead of chemical vapor deposition (CVD) because PECVD is performed at 380° C., whereas CVD is performed above 700° C. Since the eutectic temperature of aluminum-silicon is 577° C., the CVD temperature would be destructive. Above 450° C., silicon is readily dissolved in aluminum, moving rapidly along aluminum grain boundaries, and precipitating out of solution some distance from the dissolution site.

Figure 6:
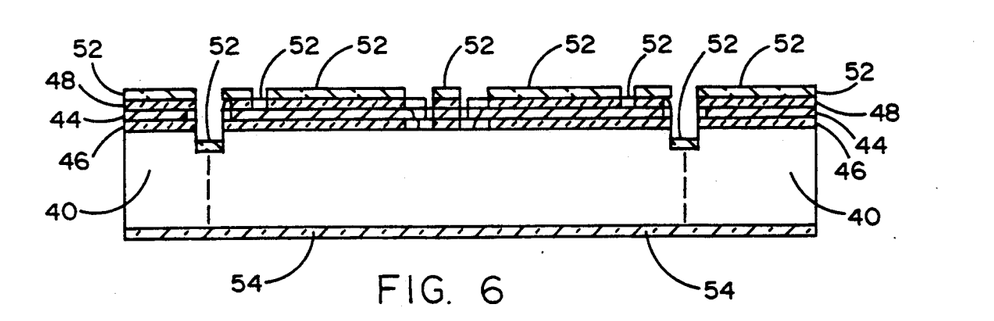

The thickness of the insulation films 52 and 54 must be carefully chosen. The film 52 should be thick enough to avoid excessive capacitance and prevent cross-talk between the aluminum conductors below the film and the gold conductors above the film. However, excessive thickness of film 52 may cause stress on the metallic conductors.

Figure 7:
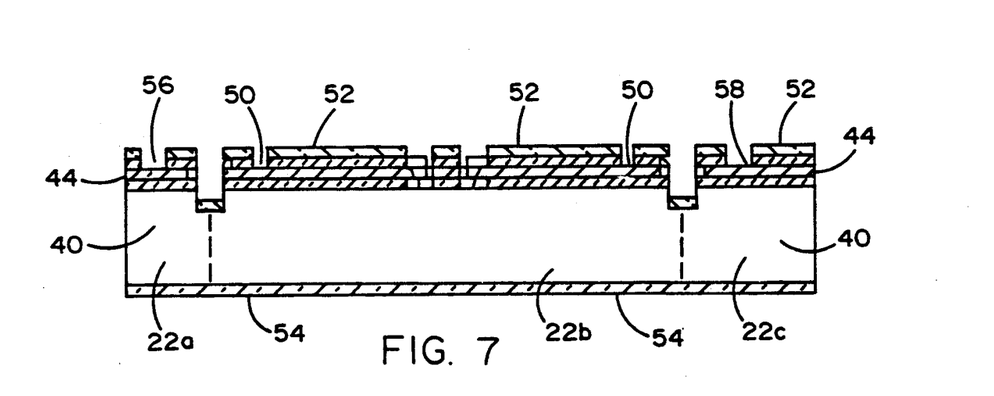

FIG. 7 shows the wafer cross-section after performing selective etching to form certain openings in the layer 52. New streets 56 and 58 are formed in the adjacent dice 22a and 22c, respectively. And the film 52 is removed from the openings 50, into which metal will be deposited to provide conductor terminals. Prior to etching, a photolithographic process is used to permit etching only where desired. The entire surface of the passivation 52 is covered with a layer of photoresist. Then a mask is placed over the photoresist, and the uncovered portions of the photoresist are subjected to ultraviolet radiation. If the photoresist is positive, the areas in which the passivation 52 is to be removed will be those defined by the holes in the mask. Those areas are then left unprotected by removing (dissolving) the photoresist, i.e., at the new streets 56 and 58, and at the terminal openings 50.

Then the wafer is placed in a buffered oxide etch (BOE), in which the passivation 52 in the unprotected areas is removed. Silicon is not etched by the BOE. The etching time to remove passivation is carefully controlled to avoid undercutting. Witness or dummy wafers may be used for such control.

The undeveloped photoresist limits etching of the passivation to the desired locations. After the etching is completed, the photoresist is removed by a solvent. At this point, the cross-section of the wafer is as shown in FIG. 7. Except for the terminal openings 50 and the ne streets 56 and 58, the front wafer surface is covered by a layer 52 of passivation at least 1.0 micron thick. During the BOE etching, the thickness of layer 54 was reduced slightly. But its etching rate was much lower than the etching rate of the layer 52. So the passivation layer 54 remains sufficiently thick after the BOE etching.

Figure 8:
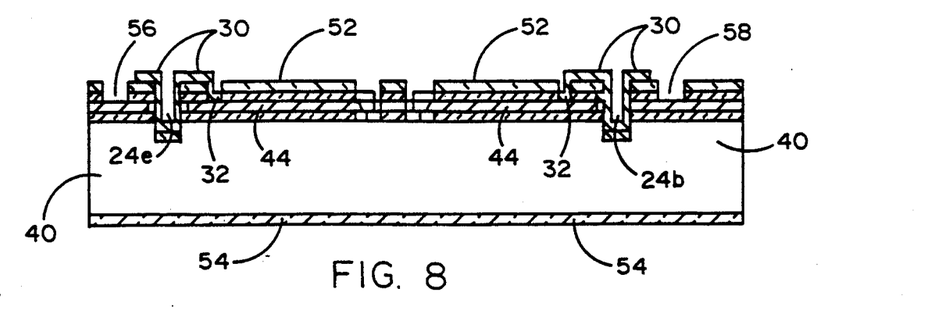

FIG. 8 shows the wafer cross-section after deposition of a field metal layer, then plating-up of the gold leads, and finally removal of the undesired portions of the field metal layer. The initial field metal layer covers the entire surface of the wafer, and acts as an electrical conductor during the gold plating process. A very thin layer of field metal is first deposited over the entire front surface of the wafer. This field metal layer consists of a coating of titanium-tungsten (Ti-W) alloy, followed immediately by a coating of gold (Au). The Ti-W and Au materials are deposited by a sputtering process, which is continuous, i.e., deposition of the Ti-W and of the Au is accomplished during the same sputtering run. The Ti-W alloy has excellent adhesion to both the oxide and metal surfaces that it covers, and it also makes good electrical contact. Because any exposed aluminum tends to form an oxide, just prior to sputtering on the field metal, a light sputtering etch is carried out, in order to remove aluminum oxide, which would have an insulating effect.

Gold, which does not oxidize, does not adhere well to an oxide. Its inclusion in the sputtering run prevents formation of an oxide on the surface of the Ti-W alloy. Subsequently, the gold leads will be built up (thickened) by electro-plating additional gold on the initial gold coating until the gold reaches a thickness of approximately 2.5 microns. This is done after photoresist is applied to cover the field metal, except where gold leads are desired.

The dimensions and routing of the metallization which provides the gold rerouting leads have been chosen to minimize both resistance and capacitance. Gold may be preferred for it low electrical resistance, electroplating ease, and chemical inertness, especially because it does not form an oxide. This latter property means that it is expected to have low electrical contact resistance, but poor adherence to oxide-like surfaces. That shortcoming is overcome by the use of an adhesion metal beneath the gold, such as titanium, aluminum or, better, the titanium-tungsten alloy.

Metals other than gold may be used instead of gold, if the trade-off is considered desirable in a given situation. In other words, it may be preferable to use, as material for the rerouting or extending leads, a material having certain characteristics which are better than aluminum, but inferior to gold, if other characteristics of such material provide an attractive trade-off relative to gold. The primary disadvantages of gold are (a) its high cost; (b) the special efforts needed to cause it to adhere to certain materials; and (c) its undesirable property as a recombination center in silicon. The latter characteristic is due to the position of gold in the band gap in silicon, which makes gold a potential destroyer of carriers, under the influence of high processing temperatures, such as those used in diffusion and in thermal oxidation.

As stated in this application, the favorable characteristics of gold include (a) its excellent electrical conduction both in the rerouted or extended leads and at the T-connections, (b) the ease of thickening it by plating, and (c) its resistance to etching when aluminum is removed after stacking. The non-oxidizing nature of gold, and its relative chemical inertness, contribute to its favorable characteristics. Other metals, such as copper, silver, nickel, and/or their various alloys, may in some cases provide desirable trade-offs relative to gold, because they will provide, to a significant extent, its favorable qualities, while they will avoid, to some extent, one or more of its disadvantages. The resistivity figures for the metals referred to are, in the order of highest conductivity: silver 1.59, copper 1.67, gold 2.35, aluminum 2.65, and nickel 6.48.

Photolithography is used to delineate the paths of the plated gold leads. The entire field metal coating is covered with photoresist. A mask is then used having openings which define the terminals and the desired paths of the rerouted gold leads. After removing the photoresist from those lead-defining paths, an electroplating process is used to build up the gold thickness of the rerouted leads. The entire wafer is put into a gold plating bath, in which the electrical current is provided via the field metal coating.

Next, the field metal layer is removed (except for the rerouted leads) by first dissolving the remaining photoresist, and then briefly placing the wafer in successive etching materials which remove the thin field metal coating. A first etchant is used for the thin gold layer and a second etchant for the thin Ti-W layer. Each etchant is used for a very short period. The gold etchant also removes some of the plated gold of the rerouted leads, but not enough to affect the conducting efficiency of the leads. Gold is one of the most corrosion (etching) resistant metals, but it can be removed by suitable etchants. For example, the gold etch which has been successfully used in the present process contains potassium (K), iodine (I) and water, in the proportions of 113 grams of K, 65 grams of I, and 100 cc. of water. A satisfactory etch for the Ti-W layer is hydrogen peroxide ($H_2O_2$) at 45° C. The etchants used to remove the field metal do not remove either the passivation material or the aluminum.

At this point the cross-section corresponds to FIG. 8. The thick gold leads 30 (see also FIGS. 2 and 4) have gold terminals 32 which are in electrical contact with the aluminum metallization 44. The rerouting gold leads 30 extend from the terminals 32 to the new terminals (34 in FIGS. 2 and 4) which will be in electrical contact (by means of T-connections) with metallization (gold) applied to the access surface of the stacked module into which the modified chips have been incorporated. Note that the new gold leads pass through the streets 24e and 24f in the original wafer.

Figure 9:
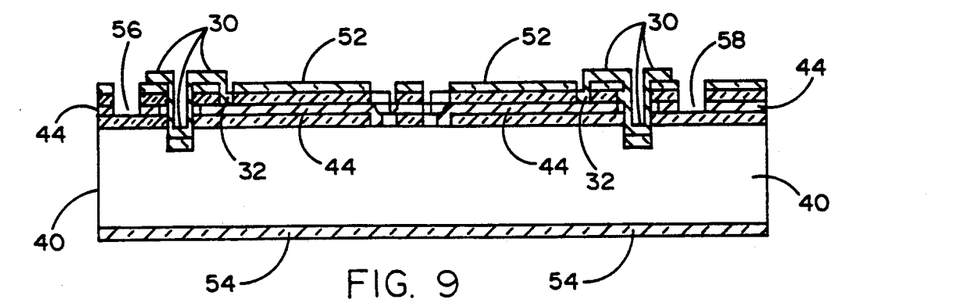

FIG. 9 shows the wafer cross-section of the modified die, which is ready to be cut out of the wafer and then placed in a stacked module. The only change from FIG. 8 to FIG. 9 is the removal of the aluminum 44 from the new streets 56 and 58. This removal may be accomplished by exposing the wafer to an aluminum-only etching material containing phosphoric acid and nitric acid. This etching material attacks the aluminum, but does not attack the gold leads, the passivation layers, or the silicon.

Subsequently, after wafer testing, the modified dice (chips) are cut out of the wafer, cutting along the lines provided by the new streets (56, 58, and the orthogonal streets). A modified chip, ready for stacking, is shown in FIG. 4. In addition to the gold rerouting leads, the modified chip has four spacer pads 59 which engage the next layer after stacking. Two of the pads, located at the chip edge having lead terminals 34, are triangular. This shape later permits depth of lapping of the edge to be determined by measuring the width of the triangular pads.

The stack building steps are then performed, using the chips provided by the modified dice. The particular laminating process is not part of the present invention. One such process is described and claimed in common assignee U.S. Pat. No. 4,617,160. Generally, the chips of a stack are (a) selected in accordance with precise thickness measurement; (b) stacked in a fixture which holds them in alignment; (c) provided with a measured amount of adhesive (epoxy) between each pair of adjacent chips; and (d) heated to cure the epoxy and create a solid stack. One advantage of the present invention, which improves the stacking process, is the ability of the relatively thick plated gold terminals on each chip to act as supplemental spacers between adjacent chips, thus helping to insure glue (epoxy) lines in the stack which have consistent (and very slight) thickness. Controlling the thickness of the glue lines, in order to maintain accurate lead spacing in one of the two access plane dimensions, has been a problem in stacked chip modules.

After forming a laminated stack of chips, several process steps are required to prepare the terminals on the access plane of the stack. FIGS. 10A-10J are isometric views illustrating successive steps, which lead to the completion of the stacked chip module ready for attachment to a carrier substrate. Those post-stacking process steps are disclosed and claimed in common assignee U.S. Pat. No. 4,525,921.

Figure 10A:
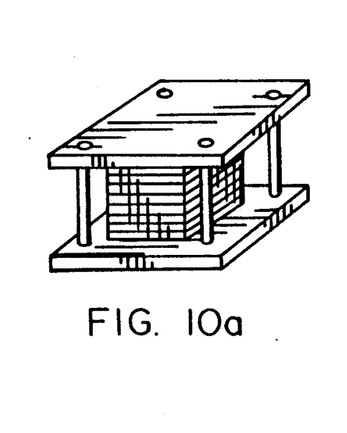
Figure 10B:
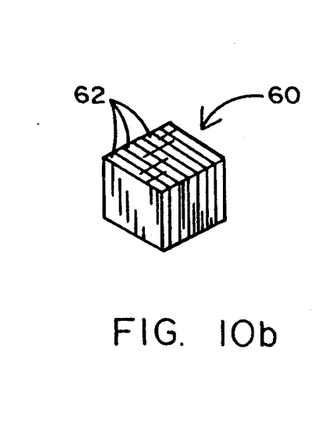
Figure 10C:
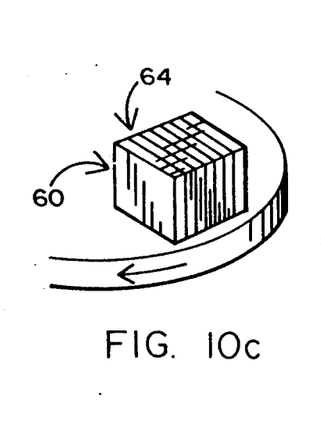
Figure 10D:
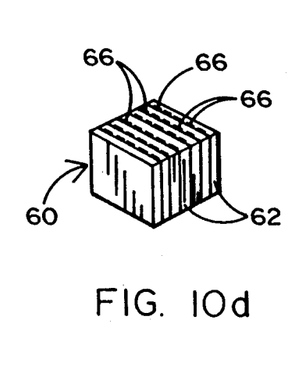
Figure 11:
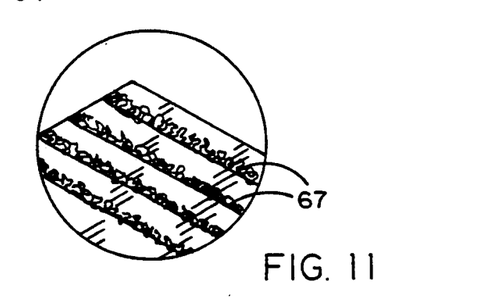
FIGS. 11 and 12 are isometric views illustrating the stack before and after a new etching step which has been inserted into the post-stacking steps.
Figure 12:
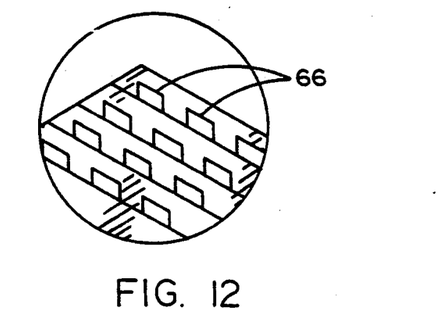

FIGS. 11 and 12 illustrate a new step, inserted into the process, which is a significant part of the present invention. Referring first to the previously patented process, FIG. 10A symbolizes the multiple steps leading to the laminated stack 60 of FIG. 10B, which consists of a plurality of glued together chips 62. Each chip 62 is a complete IC chip, having a multiplicity of parallel integrated circuits, each circuit having its own lead which terminates (see FIG. 10C) at the access plane 64 of the stack (shown as the top plane). FIG. 10C represents the lapping and polishing step, which removes silicon to expose the multiplicity of leads 66 seen in FIG. 10D. Note that the leads 66 form a two-dimensional pattern. The spaced leads on the edge of a single chip are considered to extend along the X-axis. The Y-axis dimension includes the aligned leads on separate chips, whose spacing is determined by the thickness of the chips.

Figure 10E:
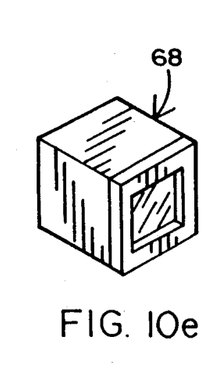
Figure 10F:
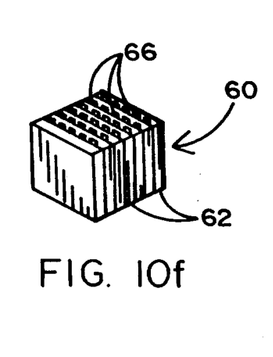

FIG. 10E shows a chamber 68, used in a plasma etching step, which removes silicon, epoxy, and insulation materials from the access plane of the stack, leaving the metal leads 66 protruding from the access plane 64 of the stack, as seen in FIG. 10F. The plasma etching is performed only on the access plane surface (or surfaces) of the module. A flash etch step may be needed to remove any remaining silicon oxide ($SiO_2$) from the access plane. This is accomplished by very briefly exposing the module to hydrofluoric acid.

FIGS. 11 and 12, as stated above, disclose a significant aspect of the overall process which is part of the present invention. They represent a step performed between FIGS. 10F and 10G. A single step performed on the stacked module accomplishes what either (a) would not be feasible, or (b) would require multiple steps and much more complexity if performed prior to formation of the stack.

As a consequence of the requirement to extend the rerouted gold signal leads (30 in FIG. 2) outside the area of the active (original) die, a selective metallization removal is necessary before placing the T-connection metallization on the access plane of the module. The aluminum metal 67 removed at this stage is in the dice adjacent to the modifiable die. It lies beneath the extended gold leads (or in a plane below the gold lead plane) and it has been exposed (along with the gold leads) by the plasma etching of the silicon. Initially, it was planned to remove this aluminum at the wafer level but such removal would have required many more processing steps, and would have degraded performance. By performing the removal after all the chips have been stacked in the module (module level), the metal removal is accomplished for all the chips at one time. If this spurious, unwanted original metal is not removed, there is a possibility of shorting between the various signals of the active chips in the module.

The process that was developed is removal of the spurious aluminum metal using a selective chemical etch solution ($H_3PO_4:HNO_3:H_2O$). This process is performed after the silicon etch procedure (FIG. 10F) has been performed on the stacked module. The special chemical solution removes only the unwanted aluminum metal, while not affecting the gold leads of the module. In FIG. 11, there is a mixture of unwanted aluminum metal 67 with the gold signal leads 66. FIG. 12 shows the gold signal leads 66 still protruding, while the unwanted aluminum metal has been removed.

Figure 10G:
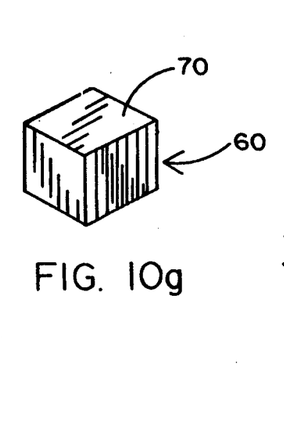
Figure 10H:
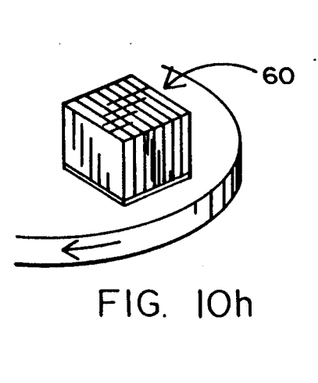

Next, in accordance with the prior process, the access plane is covered with a passivation layer 70, as shown in FIG. 10G. The preferred passivation material is polyimide. Passivation is required to insulate the metallic conductors from the silicon body of the stack. After the polyimide is applied, the metal leads need to be re-exposed. FIG. 10H shows another lapping and polishing step which uncovers the gold leads without removing the surrounding polyimide insulation.

Figure 10J:
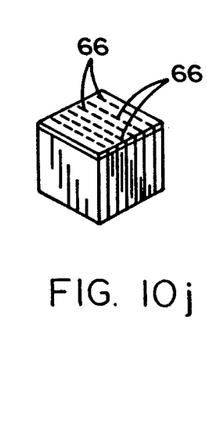
Figure 10K:
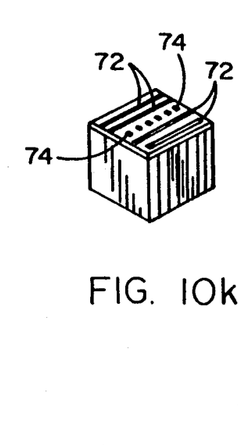

FIG. 10J shows the re-exposed leads 66. And FIG. 10K shows metallization deposited on top of, and in electrical contact with, the leads 66. In the process of applying this metallization, metallic busline strips 72 are laid down, and also metallic chip select pads 74. Beneath the strips 72 and pads 74 are terminal pads which contact the exposed leads 66, and which have larger areas than the leads 66. These junctions are referred to as "T-connections", because the leads and pads meet at right angles, and because each pad extends across and beyond the ends of its lead 66. The metallization seen in FIG. 10K preferably is applied in a plurality of layers, as detailed below. Both Ti-W and Au are used in order to obtain maximum electrical conduction and effective adhesion at the contact areas.

In the presently preferred version of the invention, the completed stack, as shown in FIG. 10K, has its conductors (metallization) all on access plane 64. Some of the conductors are shown as bus lines, and some as rectangular terminal pads. The access plane then has its conductors connected to external circuitry in any preferred manner. For example, as disclosed in common assignee U.S. Pat. No. 4,706,166, the access plane may be placed face down on a substrate face having electrical conductors which provide routing of signals between the stack circuitry and external circuitry. Suitable insulation is formed between the substrate and the access plane of the stack; and bonding bumps serve as connections between terminals on the substrate and terminals on the access plane. Other external circuitry connecting schemes are available.

Figure 13:
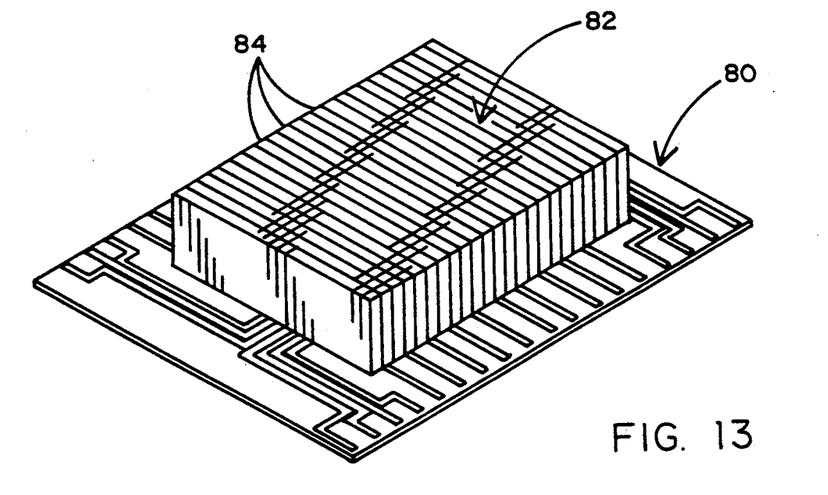
FIG. 13 shows a stack of chips mounted on a substrate.

FIG. 13, which is similar to FIG. 5 of U.S. Pat. No. 4,706,166, shows a substrate 80 having mounted thereon a stack 82 containing numerous chips 84, each of which extends in a plane perpendicular to substrate 80. Both electrical conductivity and thermal conductivity are provided by soldered bumps between terminals on the stack and aligned terminals on the substrate. If necessary, extra heat conducting (but not current conducting) bumps can be used to enhance heat dissipation. In circuitry packed as densely as that in the stacked IC chips, heat transfer is a major consideration. Heat dissipation in the range of 40-100 watts can be accomplished with silicon chips which have effective heat transfer to and through the substrate 80.

A stacked chip module can have more than one access plane, if the chips extend in planes parallel to the substrate. In such an arrangement the chip conductors could lead to more than one edge of each chip; and electrical conductors could be brought down the sides of the module to contact conductors on the substrate.

The present invention is applicable to such an arrangement. One problem with that concept, if semiconductor chips are used, is that more extensive electrical insulation between the stack and the substrate would also tend to create thermal insulation. Another potential problem is providing adequate electrical contact at the substrate/stack interface. In other words, the T-connection arrangement would not be readily available.

Figure 14:
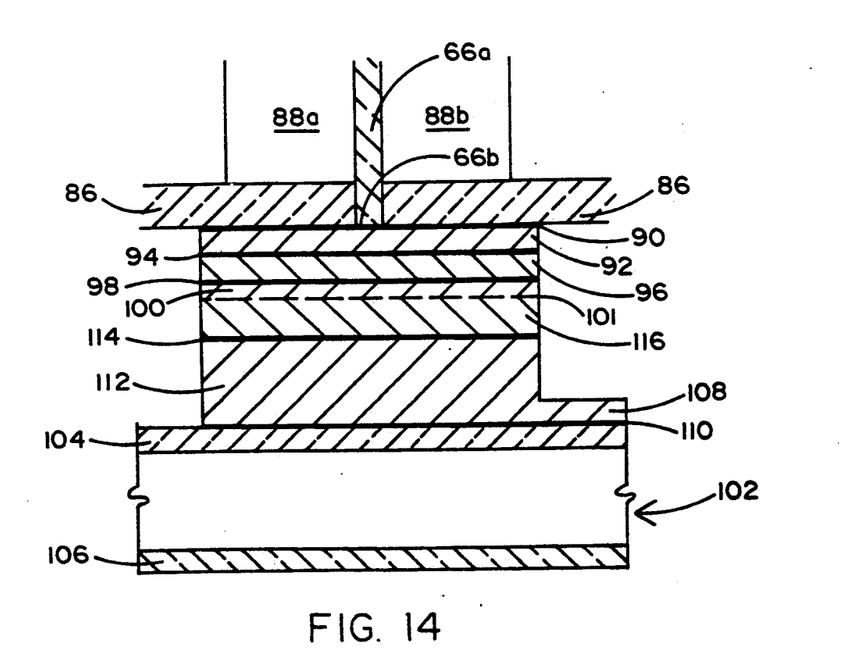
FIG. 14 is a cross-section taken through a single (one of many) bump bonds between the stack and the substrate.

FIG. 14 is a greatly enlarged close up showing successive layers of material which provide one bump bond between the stack and the substrate. The dimensions are not intended to be proportionally accurate. The metallic layers applied to the access plane of the stack are all applied by a sputtering process. One of the gold rerouting electrical leads 66a is shown terminating at 66b, where it extends to the lower surface of an insulation layer 86 of polyimide material. The polyimide layer 86 may be approximately 3.0 microns thick. The gold conductor 66a has a thickness of about 2.5 microns. Power conductor gold leads may be 10 mils wide. Other gold leads may be 5 mils wide at their terminals, and 2 mils wide between terminals. (1 mil equals 25.4 microns). The conductor 66a is one of numerous such parallel conductors located between two silicon chips 88a and 88b.

Building up the bumps on the stack for bonding to a silicon substrate 102 involves numerous steps. Building up matching bumps on the substrate 102 also involves numerous steps. Eventually the matched, aligned bumps will be soldered together under heat and pressure.

Primary emphasis is given in this description to the metallization on the access plane of the stacked chips. There are, in effect, three metallization patterns formed on the access plane. The first is pad metallization, which provides pads used for testing purposes. The second is busline and chip-select metallization, which is formed on top of the first metallization. If testing the first pad metallization indicates any defective chip(s), a layer isolation process is performed. Using photoresist and a mask, the metal pads protruding from the failed chip(s) are etched back, and then covered with polyimide.

The first metallization applied is one consisting of 0.005 by 0.010 inch pads and 0.010 by 0.010 inch pads. The larger pads are placed on Vcc and Ground lead ends. The pads have a thin initial layer 90 of sputtered titanium-tungsten alloy to provide good adhesion and low electrical resistance to the gold lead ends 66b, and also to provide good adhesion to the surrounding polyimide. The Ti-W thickness is about 0.2 micron. A much thicker (about 1.0 micron) gold layer 92 is deposited upon the Ti-W. This pad metallization allows electrical inspection of individual chips after the stacking process.

Figure 15:
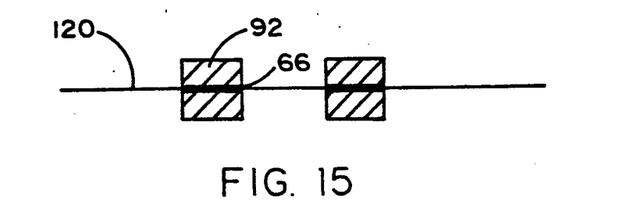
FIG. 15 is a plan view of a T-connection, showing the relative sizes of a rerouted gold lead and a gold terminal formed on the lead.

The T-connect structure (intersection of two perpendicular planes of metal) is further illustrated in FIG. 15. Two pads 92 are shown. Each pad contacts a lead 66, which is the end of a conductor extending from the interior of the stack of chips. The lead 66 is perpendicular to its pad 92. A line 120 represents the planar engaging surfaces of two adjacent chips. The area of each pad 92 is substantially larger than the lead 66 which is joined to it; and the full conductive cross-section of each lead 66 is in electrical conducting contact with its pad 92. Their perpendicular engagement, and the sputtering of the gold pad material into contact with the gold lead material insures an effective conductive bond.

The gold T-connections replace aluminum T-connections used in prior developments. The advantages of gold T-connects are extensive. Aluminum T-connects have problems of brittleness, uneven edges due to corrosion, poor conductivity due to oxide formation, and lack of cross-sectional thickness. Gold T-connects solve all of these problems, and result in major performance improvements. In fact, gold T-connects appear to have conductivity which is 2 to 3 orders of magnitude better than aluminum T-connects.

The second metallization consists of pads and buslines. Except for the chip select pads 74 (FIG. 10K), the pads 92/94 are connected from one chip to the next by the buslines 72 (FIG. 10K). For those pads not connected by buslines, a second pad layer is applied, in order to maintain equal height throughout the stack. Since buslines must also cross stack regions of nonmetallized polyimide, a thin (0.2 micron) adhesion metal layer 94 of Ti-W alloy must precede the thicker (1.0 micron) gold layer 96.

The third, and final, metallization is the solder pad metallization. The relatively thick gold layer 96 s followed by a thin (e.g., 0.2 micron) layer 98 of a barrier metal (e.g., nickel), followed by a thicker (e.g., 2 micron) layer 100 of tin/silver (Sn:Ag, 96.5:3.5) solder. A dashed line 101 represents the engaging surfaces of solder bumps on the access plane of the stack with solder bumps on the substrate 102.

As already indicated, the preferred process in applying metallization to the access plane (or planes) of the stack is sputtering, which is particularly successful in forming highly conductive T-connects. A less attractive alternative is use of deposition by evaporation.

In controlling the metallization pattern to provide fine delineation, two possibilities are: (a) etch delineation and (b) lift-off. Etch delineation requires the use of chemical etchants; and where a plurality of metals are to be etched, a plurality of etchants must be used. This has major inherent difficulties. So the lift-off method is preferred.

The lift-off method applies photoresist prior to metal delineation. Broadly the lift-off process includes: (a) covering the surface with photoresist, (b) masking the photoresist to provide the metallization pattern, (c) developing the exposed photoresist, (d) dissolving the exposed photoresist to uncover those portions of the access plane which provide the desired metallization pattern, (e) applying metal to the entire surface, and (f) dissolving the remaining photoresist, which carries along with it the metal not included in the metallization pattern.

In order to minimize bridging between the retained and removed metal, a two-stage lift-off process is used. A first layer of photoresist is applied to the entire access plane. This entire layer is only briefly exposed to ultraviolet light. Then a second layer of somewhat different photoresist is applied the access plane. A mask is used to delineate the exposed (and developed) portions of the second layer of photoresist. After the second exposure, the photoresist is removed. By using two layers of photoresist and two exposures to develop the photoresist, a slight photoresist overhang is produced in the areas where metal is to be deposited. This creates discontinuity of the sputtered metal.

The sputtering process is first used to apply the thin layer 90 of titanium-tungsten (Ti-W) to the access plane; and it is then used to apply the much thicker layer 92 of gold (Au) on top of layer 90. Layer 92 is a gold terminal pad in the first metallization stage. The Ti-W is necessary to provide adhesion of the gold layer to the polyimide, while at the same time providing electrical conductivity which maintains the full electrical contact efficiency of the gold-to-gold T-connection (i.e., 66b to 92). Suggested thicknesses of layers 90 and 92 are 0.2 micron and 1.0 micron, respectively.

After testing the terminal pads 92, and isolating any defective chips, the second stage of metallization is applied. Like the first stage, it comprises the thin (0.2 micron) layer 94 of Ti-W, and the thicker (1.0 micron) layer 96 of Au. These layers are also applied by sputtering. Because the first stage has rectangular pads, and the second stage primarily has elongated buslines, the first and second stages require separate photoresist lift off patterns. Also the busline gold deposited will be thicker in the spaces between the first stage terminal pads.

The third stage of metallization also requires a photoresist lift off pattern; and also comprises two layers. The mask used in the first pad deposition may be used. A thin (0.2 micron) layer 98 of nickel (Ni) is sputtered on. And then the thicker (1.5 micron) layer 100 of solder (tin/silver) is sputtered on. The layer of Ni is required to prevent leaching of the gold into the solder when heat is applied to bump bond the solder bumps on the stack to the solder bumps on the substrate. As previously stated, suitable tin/silver composition of solder bumps 100 is 96.5 Sn/3.5 Ag.

The lower portion of FIG. 14 shows the material layers on the substrate. The silicon substrate 102 carries a top surface passivation layer 104 (about 1.0 micron thick), and a bottom surface passivation layer (about 1.0 micron thick). A gold conductor 108 leads into a much thicker gold terminal pad 112. Above pad 112 is a thin (about 0.2 micron thick) Ni layer 114. And above layer 114 is a tin/lead solder bump 116. A suitable composition of the tin/lead solder bumps 116 is 63 Sn/37 Pb. When the aligned solder bumps 100 and 116 are engaged with one another (see line 101) under suitable heat and pressure, the stack of chips is effectively secured to the substrate mechanically, and each pair of engaging solder bumps provides an electrical and/or thermal path. The resulting electronic module has extremely dense circuitry (e.g., a terabit of memory in a volume less than one cubic foot), combined with very effective heat dissipation. Because of the effective heat conduction of silicon, and the high bump density at the access plane/substrate interface, this module can dissipate 100 watts of heat or more, depending upon the heat sink which is used.

The solder bump bonding, therefore, is not only vital as an electrical interface, but as a heat dissipation path. In fact, in some instances, extra bump bonds may be added solely as heat conductors (without electrical conduction).

From the foregoing description, it will be apparent that the apparatus and method disclosed in this application will provide the significant functional benefits summarized in the introductory portion of the specification.

The following claims are intended not only to cover the specific embodiments and methods disclosed, but also to cover the inventive concepts explained herein with the maximum breadth and comprehensiveness permitted by the prior art.

What is claimed is:

1. A method of forming a dense electronic package comprising:
providing a wafer having multiple IC chips formed thereon, each chip having metallization forming I/O terminals;
adding a layer of passivation over the active surface of the wafer;
forming a plurality of second level electrical conductors on top of the passivation layer, such conductors (a) being formed of metallic material which is different from the chip metallization material, and (b) each extending between a first I/O terminal lead in contact with a chip I/O terminal and a second I/O lead terminal available for external electrical I/O connection;
cutting from the wafer a plurality of individual IC chips, each having a plurality of second level conductors and each having its second I/O terminal leads accessible for external connection;
integrating a plurality of such IC chips in a stack which has at least one access plane on which the second I/O terminal leads of the second level electrical connectors are exposed;
forming a plurality of terminal pads on the access plane, each pad (a) being in electrical contact with one of the access plane I/O terminal leads in the form of a T-shaped connection, and (b) being formed of the same metallic material as that of the electrical conductor which it contacts;
the metallic material which forms the second level electrical connectors and the terminal pads on the access plane being both (a) more chemically inert and (b) easier to process for maximum conductance at the T-shaped connections than the chip metallization material; and
then connecting the access plane terminal pads to exterior circuitry.

2. The method of claim 1 in which:
the metallic material which forms the second level conductors and their T-connection lead/pad terminals is gold.

3. The method of claim 1, which also comprises:
thickening the second level electrical conductors to substantially increase their conductance.

4. The method of claim 2, which also comprises:
forming a thin layer of an adhesive metal between each gold surface and non-gold surface, in order to provide adhesion of the non-oxidizing gold to the other surface.

5. The method of claim 4, in which:
the adhesive metal is titanium/tungsten alloy.

6. The method of claim 1, which also comprises:
removing, from the access plane of the stack, material of the IC chip edges, in such a way as to leave protruding from the access plane the metal I/O terminal leads formed by the second level electrical conductors;
selectively etching to remove any metal other than that of the second level electrical conductors; and
applying a layer of passivation to cover the access plane except where I/O terminal leads are exposed.

7. The method of claim 6, in which:
the protruding leads comprise aluminum in the original wafer and non-aluminum metal leads provided by the second level electrical conductors; and
the selective etching removes the aluminum, but not the other metal.

8. The method of claim 1 in which:
the layer of passivation added over the active surface of the wafer is silicon oxy-nitride.

9. The method of claim 8, in which:
the layer of silicon oxy-nitride is formed by plasma-enhanced chemical vapor deposition.

10. The method of claim 8 which also comprises:
adding a layer of silicon nitride passivation over the non-active surface of the wafer.

11. The method of claim 1 which also comprises:
subjecting the wafer passivation to photo-lithographic processes by which desired openings are formed through the passivation.

12. The method of claim 1 in which:
the terminal pads on the access plane which form T-shaped connections with the second level conductors are formed by means of a sputtering process.

13. The method of claim 1 in which:
the layer of passivation added over the active surface of the wafer is a polyimide material.

* * * * *

UNITED STATES PATENT AND TRADEMARK OFFICE
CERTIFICATE OF CORRECTION

| | | |
|---|---|---|
| PATENT NO. | : 5,104,820 | Page 1 of 1 |
| APPLICATION NO. | : 07/720025 | |
| DATED | : April 14, 1992 | |
| INVENTOR(S) | : Tiong C. Go, deceased et al. | |

It is certified that error appears in the above-identified patent and that said Letters Patent is hereby corrected as shown below:

ON THE COVER PAGE:

(63) "Continuation of Ser. No. 377,241, Jul. 7, 1989, abandoned", should read --Continuation-In-Part of Ser. No. 377,241, Jul. 7, 1989, abandoned--

Signed and Sealed this

Third Day of March, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 5,104,820 | Page 1 of 1 |
| APPLICATION NO. | : 07/720025 | |
| DATED | : April 14, 1992 | |
| INVENTOR(S) | : Tiong C. Go et al. | |

It is certified that error appears in the above-identified patent and that said Letters Patent is hereby corrected as shown below:

IN THE FIRST PARAGRAPH OF SPECIFICATION

The following is added at Column 1, Line 8:

"Statement Regarding Federally Sponsored Research and Development

The elements of this invention claimed in Claim Number 1 and Claim Numbers 6 through 11 of this application were made with Government support under Contract 87F362900 awarded by Michelline S. Grabulis (703) 351-2662. The Government has certain rights in the invention pursuant to the aforestated claim numbers."

Signed and Sealed this

Fourteenth Day of April, 2009

JOHN DOLL
*Acting Director of the United States Patent and Trademark Office*